(12) United States Patent
Whittington et al.

(10) Patent No.: US 8,446,143 B2
(45) Date of Patent: May 21, 2013

(54) SELF-CALIBRATION CIRCUIT WITH GYRATED OUTPUT IMPEDANCE

(75) Inventors: Mark Whittington, Austin, TX (US); Zaher G. Harb, Round Rock, TX (US)

(73) Assignee: National Instruments Corporation, Austin, TX (US)

( * ) Notice: Subject to any disclaimer, the term of this patent is extended or adjusted under 35 U.S.C. 154(b) by 387 days.

(21) Appl. No.: 12/399,182

(22) Filed: Mar. 6, 2009

(65) Prior Publication Data

US 2009/0322310 A1 Dec. 31, 2009

Related U.S. Application Data

(60) Provisional application No. 61/076,415, filed on Jun. 27, 2008.

(51) Int. Cl.
*G01R 11/32* (2006.01)

(52) U.S. Cl.
USPC .......................................................... 324/74

(58) Field of Classification Search
None
See application file for complete search history.

(56) References Cited

U.S. PATENT DOCUMENTS

| | | | |
|---|---|---|---|
| 4,390,949 A | 6/1983 | Beningfield et al. | |
| 4,553,091 A | 11/1985 | Bristol | |
| 4,704,558 A | 11/1987 | Addis et al. | |
| 5,180,973 A | 1/1993 | Hoogendijk | |
| 5,272,449 A | 12/1993 | Izawa | |
| 5,920,187 A * | 7/1999 | Cosgrove et al. | 324/74 |
| 6,269,317 B1 | 7/2001 | Schachner et al. | |
| 6,351,112 B1 | 2/2002 | Felps et al. | |
| 6,490,535 B1 | 12/2002 | Hansen | |
| 6,826,506 B2 | 11/2004 | Adamian et al. | |
| 6,920,407 B2 | 7/2005 | Adamian et al. | |
| 6,958,612 B2 | 10/2005 | Sakayori | |
| 7,103,477 B1 | 9/2006 | Lee | |
| 7,809,518 B2 | 10/2010 | Zhu et al. | |
| 2008/0204039 A1 | 8/2008 | Wong et al. | |

* cited by examiner

*Primary Examiner* — Jermele M Hollington
(74) *Attorney, Agent, or Firm* — Meyertons Hood Kivlin Kowert & Goetzel, P.C.; Jeffrey C. Hood

(57) ABSTRACT

Various embodiments of a self-calibration circuit may solve the problem that arises in high performance oscilloscopes and in particular, RF oscilloscopes, of internally providing a precision calibration signal without degrading the bandwidth, flatness of the frequency response, and input return loss of the oscilloscope. The self-calibration circuit may be configured to implement an impedance transformation technique where active and passive circuit elements with carefully chosen values are configured in an impedance converter. During self-calibration, switching elements comprised in the self-calibration circuit may be toggled to create a servo loop comprising an amplifier within the circuit, with an attenuator and resistive component acting as feedback elements. The circuit may hence become an impedance gyrator and behave as a precision source with an impedance matching the input impedance of the load circuit.

20 Claims, 4 Drawing Sheets

SELF-CALIBRATION CIRCUIT WITH GYRATED OUTPUT IMPEDANCE

PRIORITY CLAIM

This application claims benefit of priority of provisional application Ser. No. 61/076,415 titled "Self-Calibration Circuit With Gyrated Output Impedance", filed on Jun. 27, 2008, whose inventors are Mark Whittington and Zaher Harb, and which is hereby incorporated by reference as though fully and completely set forth herein.

FIELD OF THE INVENTION

The present invention relates to the field of instrumentation, and more particularly to the design of a self-calibration circuit with gyrated output impedance.

DESCRIPTION OF THE RELATED ART

In many industrial applications (and others), instruments collect data or information from an environment or unit under test (UUT), and may also analyze and process acquired data. Some instruments provide test stimuli to a UUT. Examples of instruments include oscilloscopes, digital multimeters, pressure sensors, arbitrary waveform generators, digital waveform generators, etc. The information that may be collected by respective instruments includes information describing voltage, resistance, distance, velocity, pressure, oscillation frequency, humidity, and/or temperature, among others. Computer-based instrumentation systems typically include transducers for capturing a physical phenomenon and generating a representative electrical signal, signal conditioning logic to perform amplification on the electrical signal, isolation, and/or filtering, and analog-to-digital (A/D) conversion logic for receiving analog signals and providing corresponding digital signals to the host computer system.

In a computer-based system, the instrumentation hardware or device is typically an expansion board plugged into one of the I/O slots of the computer system. In another common instrumentation system configuration, the instrumentation hardware is coupled to the computer system via other means such as through a VXI (VME extensions for Instrumentation) bus, a GPIB (General Purpose Interface Bus), a PXI (PCI extensions for Instrumentation) bus, Ethernet, a serial port or bus, or parallel port of the computer system. The instrumentation hardware may include a DAQ (Data Acquisition) board, a computer-based instrument such as a multimeter, or another type of instrumentation device. In another common system configuration, a chassis and boards inserted in the chassis may operate as a standalone instrument or instrument suite, although in some cases a host computer may be used to configure or program the boards prior to, or during operation.

The instrumentation hardware may be configured and controlled by software executing on a host computer system coupled to the system, or by a controller card installed in the chassis. The software for configuring and controlling the instrumentation system typically includes driver software and the instrumentation application software, or the application. The driver software serves to interface the instrumentation hardware to the application and is typically supplied by the manufacturer of the instrumentation hardware or by a third party software vendor. The application is typically developed by the user of the instrumentation system and is tailored to the particular function that the user intends the instrumentation system to perform. The instrumentation hardware manufacturer or third party software vendor sometimes supplies application software for applications that are common, generic, or straightforward. Instrumentation driver software provides a high-level interface to the operations of the instrumentation device. The instrumentation driver software may operate to configure the instrumentation device for communication with the host system and to initialize hardware and software to a known state. The instrumentation driver software may also maintain a soft copy of the state of the instrument and initiated operations. Further, the instrumentation driver software communicates over the bus to move the device from state to state and to respond to device requests.

The accuracy of the electronic components used in common measurement devices or instruments, for example in oscilloscopes, can vary. Values of various characteristics of those electronic components typically drift over time and over temperature. As time progresses, or as the surrounding temperature varies, changes in component values can easily result in greater uncertainty and measurement errors. To resolve this issue, many instruments, like oscilloscopes, have to be calibrated at regular intervals. For example, one common feature in an oscilloscope is self-calibration functionality. Oscilloscope instruments that offer self-calibration typically include hardware resources such as precision voltage references to enable quick calibration of the instrument without removing it from the test system or connecting it to external calibration hardware.

A problem arises in high performance oscilloscopes, and in particular RF (radio frequency) oscilloscopes, regarding the location and mechanism whereby to internally provide a precision calibration signal. In addition, in 50 ohm and other matched systems, it is generally desirable for the internal precision calibration source output impedance to be matched to the oscilloscope input impedance, which is in RF oscilloscopes is typically 50 ohms. A commonly used self-calibration circuit and representative calibration method is shown in FIG. 3, where a switching element K1 is configured to disconnect the user input signal from the circuit and couple an internal (on-board) precision calibration signal to the desired circuitry. The switching element K1 may be either an electromechanical or solid-state device. The method illustrated by way of the circuit shown in FIG. 3 can typically provide a good all-around solution, but not without limitations such as high power, mechanical lifetime, robustness, and intrinsic parasitic elements, which may all be critical in RF oscilloscopes.

Other corresponding issues related to the prior art will become apparent to one skilled in the art after comparing such prior art with the present invention as described herein.

SUMMARY OF THE INVENTION

Various embodiments of the invention comprise a self-calibration circuit configured to provide self-calibration functionality for various instruments and/or measurement devices, such as an oscilloscope, by generating and providing an internal precision calibration signal without degrading the RF performance of the oscilloscope. Embodiments of the self-calibration circuit may eliminate the need for using higher power, complex, or custom methods of self-calibration. The self-calibration circuit may be configured to implement an impedance transformation technique where active and passive circuit elements with carefully chosen values are configured in an impedance converter. During self-calibration, switching elements comprised in the self-calibration circuit may be toggled to create a servo loop within the circuit, comprising an amplifier, with an attenuator and resistive component acting as feedback elements. The circuit may hence become an impedance gyrator and behave as a precision source having an output impedance that matches the impedance of the load.

In one set of embodiments, a self-calibration circuit within a measuring device, such as an oscilloscope, may include an attenuator having a first terminal and a second terminal, and configured to couple to load circuitry (of the oscilloscope) via a third terminal. The circuit may also include an amplifier with a first input configured to receive a calibration signal, and also having a second input and an output. Finally, the circuit may include a switching circuit configured to switchably couple the first terminal of the attenuator to the second input of the amplifier and the second terminal of the attenuator to the output of the amplifier, to form a servo loop comprising the amplifier, and the attenuator as a feedback element, with the servo loop operating as a precision signal source having an output impedance that matches an impedance of the load, to deliver the calibration signal to the load circuitry.

In some embodiments, the self-calibration circuit may also include a first resistor having one end coupled to the first terminal of the attenuator, and the switching circuit configured to switchably couple the other end of the first resistor to the second input of the amplifier and the second terminal of the attenuator to the output of the amplifier to form the servo loop. A feedback resistor may also be coupled across the output of the amplifier and the second input of the amplifier to allow the amplifier to act as a static reference source during normal operation of the oscilloscope. The first input of the attenuator is configured to receive a user input signal intended for the load circuitry during normal operation, with the switching circuit configured to switchably couple the first terminal of the attenuator to the output of the amplifier and the second terminal of the attenuator to reference ground to ground a return path of the attenuator, to deliver the user input signal to the load.

In one set of embodiments, a system capable of self-calibration may be configured with means for providing a calibration signal to a first input of an amplifier, means for coupling an attenuator to a load, means for connecting a feedback path between an output of the amplifier and a second input of the amplifier, including the attenuator in the feedback path to deliver the calibration signal to the load, and means for developing, between the first input of the amplifier and the load, a total impedance that matches an impedance of the load.

A measurement system may be configured with the capability to self-calibrate. The system may include an attenuator with a first terminal configured to receive a user input signal and a second terminal configured to couple to a load, and an amplifier having a first input configured to receive a calibration signal. A first switching element may be configured with two selectable switching configurations, with the first switching configuration coupling the first terminal of the attenuator to a second input of the amplifier, and the second switching configuration coupling the first terminal of the attenuator to an output of the amplifier. A second switching element may also be configured with two selectable switching configurations, with the first switching configuration coupling a third terminal of the attenuator to the output of the amplifier, and the second switching configuration coupling the third terminal of the attenuator to reference ground. A combination of the first switching configuration for the first switching element and the first switching configuration for the second switching element may establish a servo loop that comprises the amplifier, and the attenuator as a feedback element, with the servo loop operating as a precision signal source having an output impedance that matches an impedance of the load, to deliver the calibration signal to the load.

In addition, a feedback impedance may be coupled between a second input of the amplifier and an output of the amplifier, with a combination of the second switching configuration for the first switching element and the second switching configuration for the second switching element establishing a return path of the attenuator to ground, to deliver the user input signal to the load. In some embodiments. The amplifier may be a differential amplifier, with the first input of the amplifier configured as an inverting input, and the second input of the amplifier configured as a non-inverting input. The measurement system may actually be any device that may require calibration, with the load representing the internal circuitry of the device, and the calibration signal being switched to the input of the device that normally receives a user input signal.

Other aspects of the present invention will become apparent with reference to the drawings and detailed description of the drawings that follow.

BRIEF DESCRIPTION OF THE DRAWINGS

A better understanding of the present invention can be obtained when the following detailed description of the preferred embodiment is considered in conjunction with the following drawings, in which.

Figure 1:
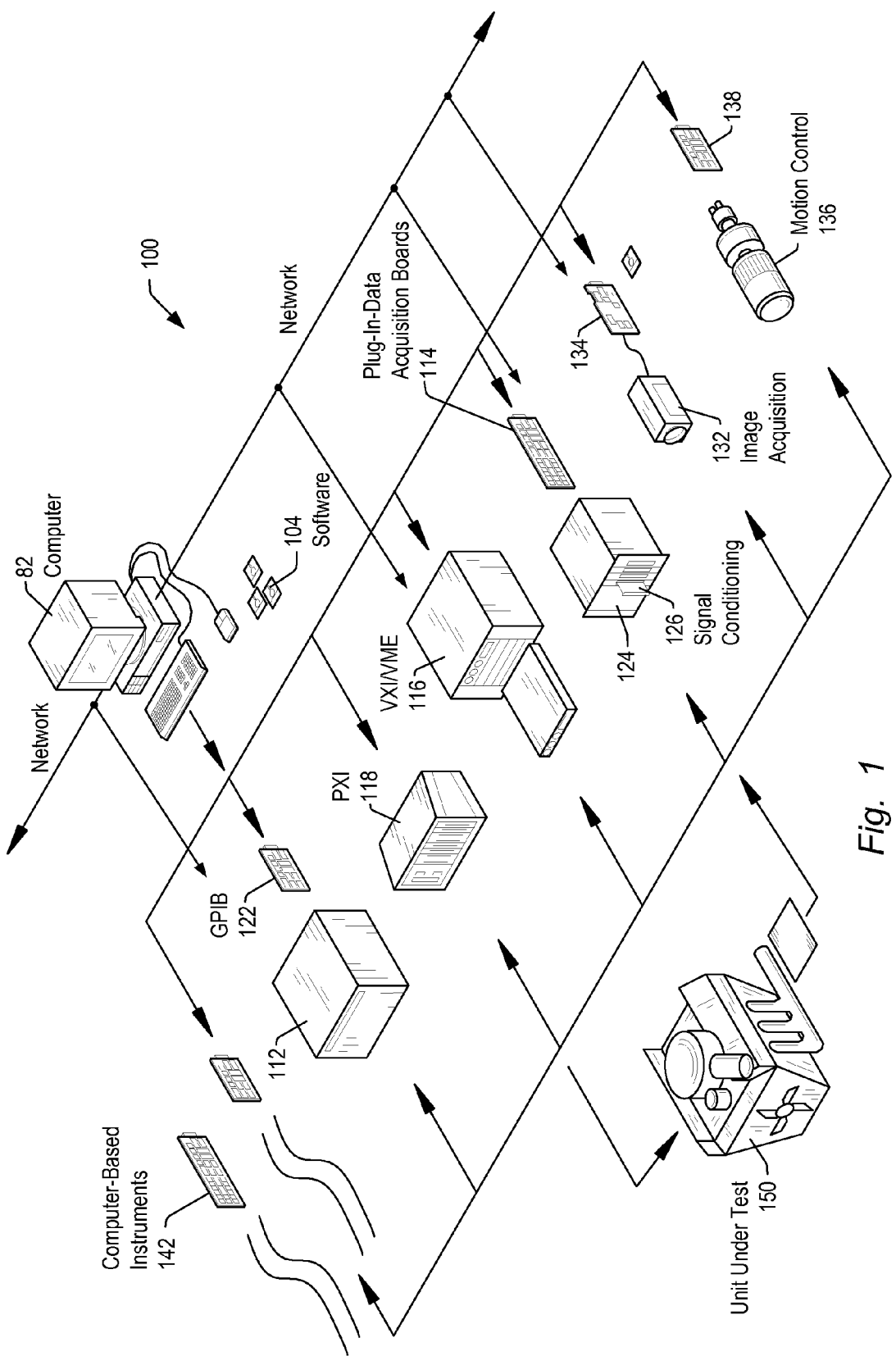
FIG. 1 shows an instrumentation control system with instruments networked together according to one embodiment of the invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

Embodiments of the present invention may be used in systems configured to perform test and/or measurement functions, to control and/or model instrumentation or industrial automation hardware, or to model and simulate functions, e.g., modeling or simulating a device or product being developed or tested, etc. More specifically, it may be used in various instances where input protection for instrumentation equipment is required, without degrading the performance of the protected instrumentation equipment. However, it is noted that the present invention may equally be used for a variety of applications, and is not limited to the applications enumerated above. In other words, applications discussed in the present description are exemplary only, and the present invention may be used in any of various types of systems. Thus, the system and method of the present invention may be used in any number of different applications.

FIG. 1 illustrates an exemplary instrumentation control system 100 which may be configured according to embodiments of the present invention. System 100 comprises a host computer 82 which may couple to one or more instruments configured to perform a variety of functions using timing control implemented according to various embodiments of the present invention. Host computer 82 may comprise a CPU, a display screen, memory, and one or more input devices such as a mouse or keyboard as shown. Computer 82 may operate with one or more instruments to analyze, measure, or control a unit under test (UUT) or process 150. The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices.

The computer system may couple to and operate with one or more of these instruments. In some embodiments, the computer system may be coupled to one or more of these instruments via a network connection, such as an Ethernet connection, for example, which may facilitate running a high-level synchronization protocol between the computer system and the coupled instruments. The instruments may be coupled to the unit under test (UUT) or process 150, or may be coupled to receive field signals, typically generated by transducers. System 100 may be used in a data acquisition and control applications, in a test and measurement application, an image processing or machine vision application, a process control application, a man-machine interface application, a simulation application, or a hardware-in-the-loop validation application, among others.

Figure 2:
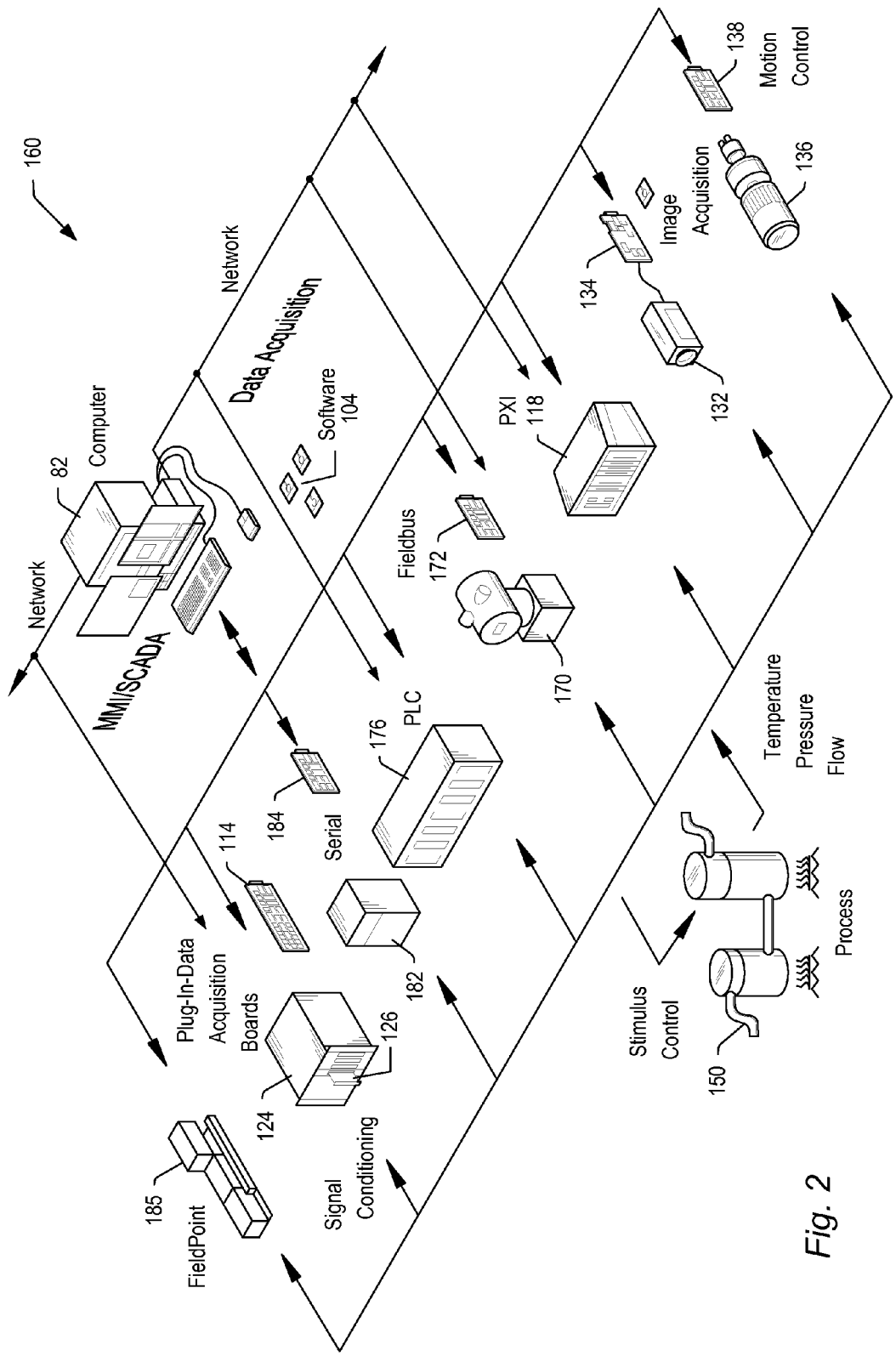
FIG. 2 shows an industrial automation system with instruments networked together according to one embodiment of the invention.
Figure 3:
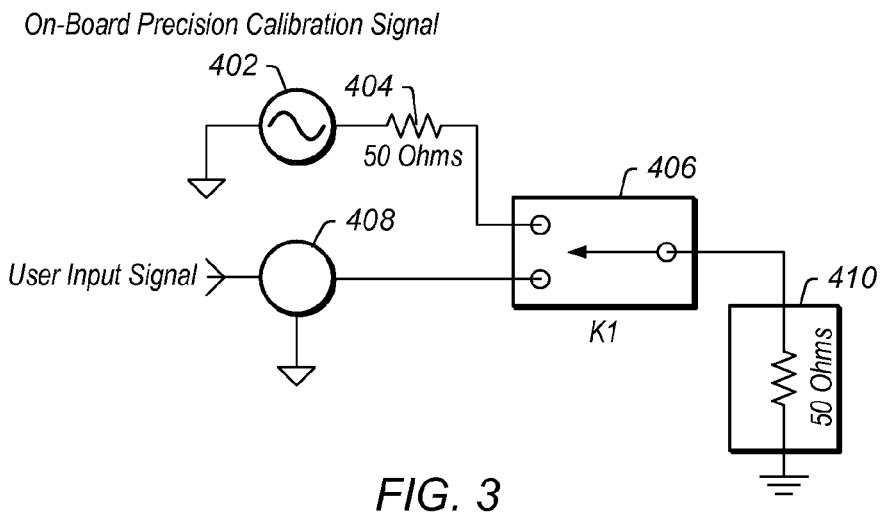
FIG. 3 shows a self-calibration circuit using a switching element, designed according to prior art principles.

FIG. 2 illustrates an exemplary industrial automation system 160 that may be configured according to embodiments of the present invention. Industrial automation system 160 may be similar to instrumentation or test and measurement system 100 shown in FIG. 2A. Elements that are similar or identical to elements in FIG. 1 have the same reference numerals for convenience. System 160 may comprise a computer 82 which may couple to one or more devices and/or instruments configured to perform a variety of functions using timing control implemented according to various embodiments of the present invention. Computer 82 may comprise a CPU, a display screen, memory, and one or more input devices such as a mouse or keyboard as shown. Computer 82 may operate with the one or more devices and/or instruments to perform an automation function, such as MMI (Man Machine Interface), SCADA (Supervisory Control and Data Acquisition), portable or distributed data acquisition, process control, and advanced analysis, among others, on process or device 150.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a field bus device 170 and associated field bus interface card 172, a PLC (Programmable Logic Controller) 176, a serial instrument 182 and associated serial interface card 184, or a distributed data acquisition system, such as the Compact FieldPoint or CompactRIO systems available from National Instruments, among other types of devices. In some embodiments, similar to the system shown in FIG. 1, the computer system may couple to one or more of the instruments/devices via a network connection, such as an Ethernet connection.

Figure 4A:
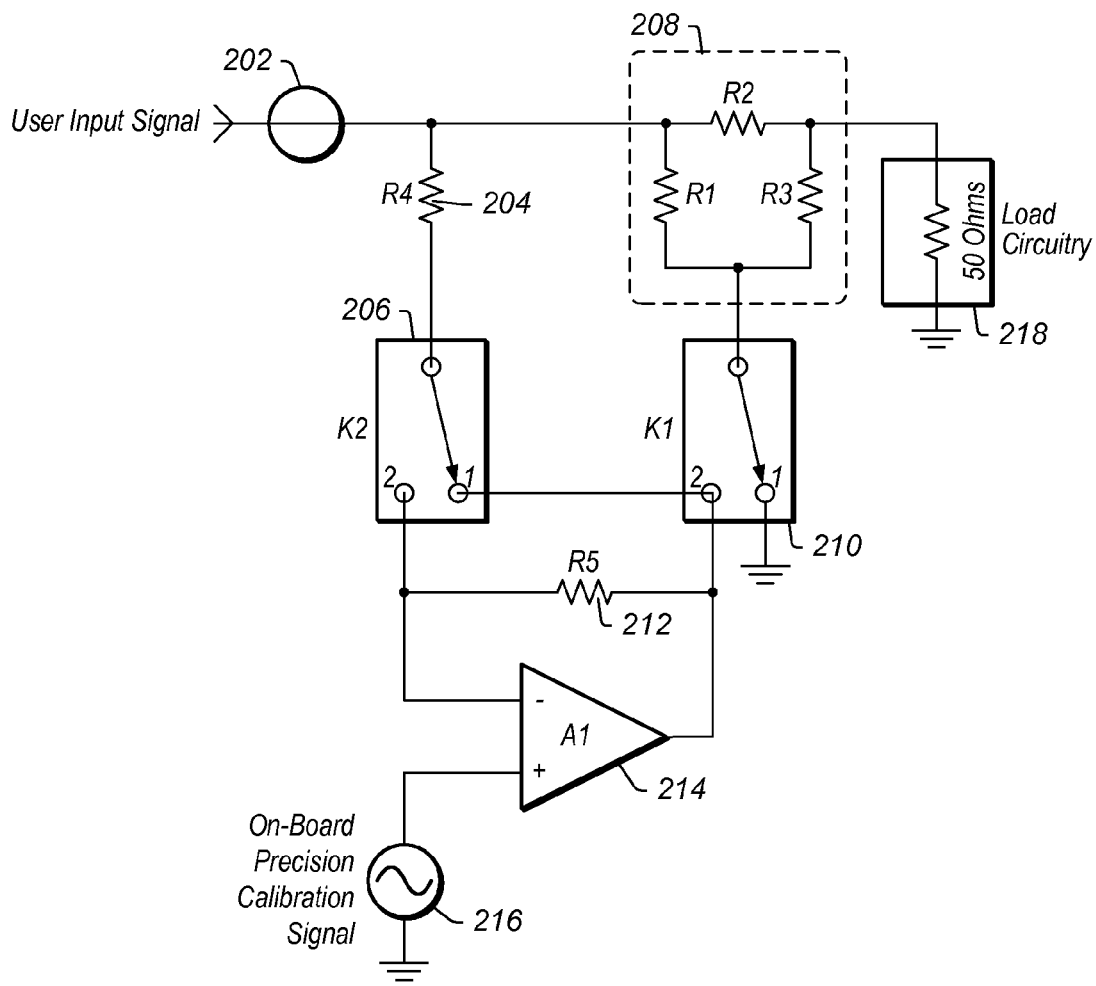
FIG. 4a shows one embodiment of a self-calibration circuit that uses an impedance transformation technique, operating in normal mode.

FIG. 4a illustrates a self-calibration circuit implementing an impedance transformation technique, configured according to one embodiment of the present invention. The self-calibration circuit shown in FIG. 4 may be included in an instrument or device requiring calibration, for example in an oscilloscope. In other words, the self-calibration circuit may be used to calibrate various measuring instruments/equipment, such as an oscilloscope, that may be configured in a system such as the one shown in FIG. 1 and/or FIG. 2. The self-calibration circuit shown in FIG. 4a is configured to implement an impedance transformation technique using active and passive circuit elements with carefully chosen values, to operate an impedance converter. The passive elements may include resistors 204 and 212, and attenuator 208 comprising resistors R1, R2, and R3. The active circuit element may be a differential input amplifier 214. Switching elements 206 and 210 may be configured to allow switching between normal and calibrating operating modes. As shown in FIG. 4a, the self-calibration circuit is switched to operate in normal mode.

During normal operation, switching elements 206 and 210 may both be toggled to their respective position 1. When in position 1, switching element 210 may operate to ground the return path of attenuator 208 (comprising resistors R1, R2, and R3) as shown, while switching element 206 may operate to couple resistor 204 to the output of active amplifier 214. While the attenuator configuration shown in FIG. 4a is a π-pad attenuator configuration (i.e., the resistor configuration shown is commonly referred to as a π-pad configuration in reference to the configuration of the three resistors with respect to each other), the impedance transformation technique may equally be applied to any other attenuator topology, and various embodiments of the self-calibration circuit are not limited to the embodiments explicitly disclosed herein. In this configuration, amplifier 214 may operate as a normal static reference source as user input signal 202 is provided into the circuit.

Due to the configuration of switching elements 206 and 210 in the circuit shown in FIG. 4a, the intrinsic parasitic elements inherent to switching elements 206 and 210 may not adversely affect the bandwidth, flatness of the frequency response, and input return loss of the oscilloscope. Switching elements 206 and 210 may implemented as low cost solid-state devices with much more relaxed specifications for intrinsic parasitic elements, since the parasitic elements of switching elements 206 and 210 may be masked by the damping effects of passive resistors 204 and R1, R2, and R3 configured in attenuator 208.

Figure 4B:
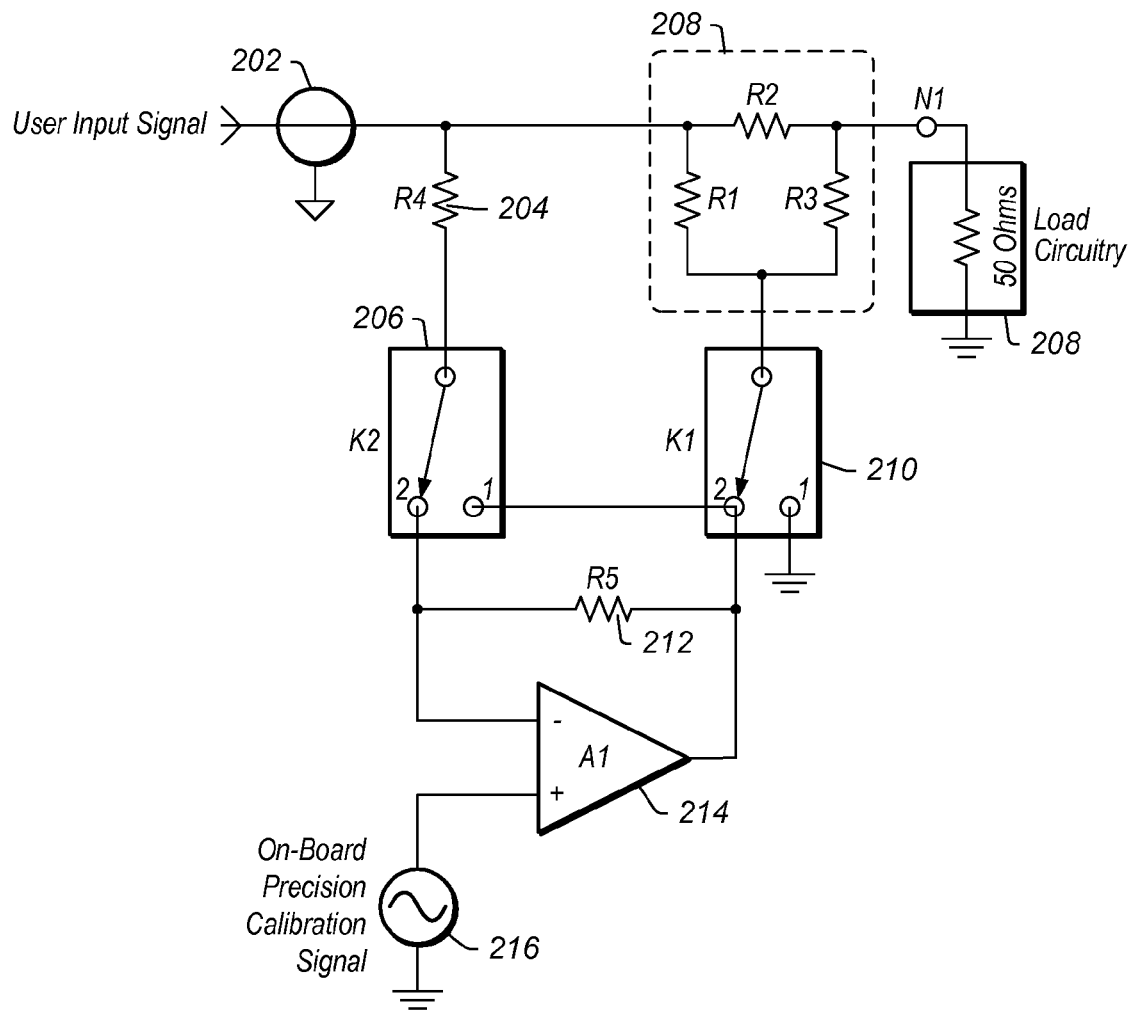
FIG. 4b shows the embodiment of the self-calibration circuit of FIG. 4a operating in self-calibration mode.
Figure 4C:
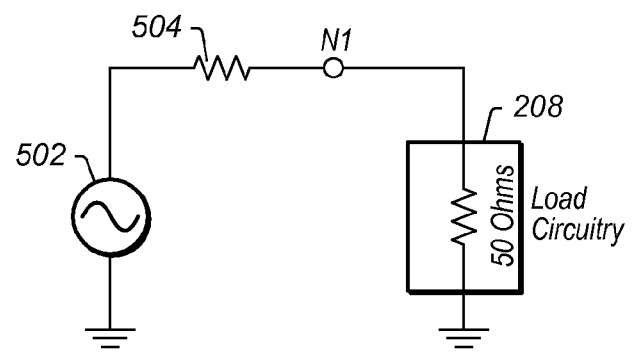
FIG. 4c shows an equivalent model of the embodiment of the self-calibration circuit of FIG. 4a operating in self-calibration mode.

During self-calibration, switching elements 206 and 210 may both be toggled to their respective position 2, as shown in FIG. 4b, thereby creating a servo loop comprising amplifier 214, with attenuator 208 and resistor 204 acting as feedback elements. The circuit may hence become an impedance gyrator and behave as a precision source with 50Ω output impedance. At connectivity node N1, which is located between the self-calibration circuitry and load circuitry 208, the self-calibration circuit shown in FIG. 4b may be reduced to the Thevenin equivalent circuit shown in FIG. 4c, that is, a voltage source 502 with an impedance 504, which may be matched to the load circuitry, in this case 50Ω. Those skilled in the art will appreciate that the 50Ω load impedance is shown by way of example as a typical load impedance, and that various alternate embodiments may be equally configured for a load impedance other than 50Ω, with the values of resistors 204 and R1, R2, and R3 (of attenuator 208) selected to correspond to a matching load impedance 504 in the equivalent circuit shown in FIG. 4c.

Thus, one benefit of the self-calibration circuit shown in FIGS. 4a and 4b is its elimination of the problem that arises in high performance oscilloscopes and in particular, RF oscilloscopes, of internally providing a precision calibration signal without degrading the bandwidth, flatness of the frequency response, and input return loss of the oscilloscope. The illustrated impedance transformation technique may operate to obtain the desired circuit behavior without the limitation of high power, mechanical lifetime, robustness, and intrinsic parasitic elements, which are particularly critical in RF oscilloscopes.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A circuit comprising:
   an attenuator having a first terminal and a second terminal, and configured to couple to a load via a third terminal;
   an amplifier having a first input configured to receive a calibration signal, and further having a second input and an output;
   a switching circuit for switching between normal operating mode and calibrating operating mode, configured to switchably couple the first terminal of the attenuator to the second input of the amplifier and the second terminal of the attenuator to the output of the amplifier to form a servo loop comprising the amplifier with the attenuator as a feedback element, wherein the servo loop operates as a precision signal source having an output impedance that matches an impedance of the load, to deliver the calibration signal to the load.

2. The circuit of claim 1, further comprising a first resistor having one end coupled to the first terminal of the attenuator, wherein the switching circuit is configured to switchably couple the other end of the first resistor to the second input of the amplifier and the second terminal of the attenuator to the output of the amplifier to form the servo loop.

3. The circuit of claim 1, further comprising a first resistor coupled across the output of the amplifier and the second input of the amplifier.

4. The circuit of claim 1, wherein the attenuator comprises a resistor network.

5. The circuit of claim 1, wherein the first input of the attenuator is configured to receive a user input signal intended for the load;
   wherein the switching circuit is further configured to switchably couple the first terminal of the attenuator to the output of the amplifier and the second terminal of the attenuator to reference ground to ground a return path of the attenuator, to deliver the user input signal to the load.

6. The circuit of claim 1, wherein the circuit is configured as a self-calibration circuit comprised in a measurement device.

7. The circuit of claim 6, wherein the measurement device is an oscilloscope.

8. A self-calibration system comprising:
   means for providing a calibration signal to a first input of an amplifier;
   means for coupling an attenuator to a load; and
   means for switching between normal operating mode and calibrating operating mode, comprising:
     means for connecting a feedback path between an output of the amplifier and a second input of the amplifier, and including the attenuator in the feedback path to deliver the calibration signal to the load when switching from normal operating mode to calibrating operating mode; and
     means for developing, between the first input of the amplifier and the load, a total impedance that matches an impedance of the load when switching from normal operating mode to calibrating operating mode.

9. The self-calibration system of claim 8, wherein said means for switchably connecting the feedback path comprises:
   means for toggling a first switching element to couple a first terminal of the attenuator to the second input of the amplifier; and
   means for toggling a second switching element to couple a second terminal of the attenuator to the output of the amplifier.

10. The self-calibration system of claim 9, further comprising:
    a resistor having a one end coupled to the first terminal of the attenuator and the other end coupled to the first switching element;
    wherein said means for connecting the feedback path comprises means for toggling the first switching element to couple the other end of the resistor to the second input of the amplifier;
    wherein the feedback path further includes the resistor.

11. The self-calibration system of claim 8, further comprising:
    means for providing a user input signal to a first terminal of the attenuator;
    wherein the means for switching between normal operating mode and calibrating operating mode further comprises means for disconnecting the feedback path and grounding a return path of the attenuator, to deliver the user signal to the load when switching from calibrating operating mode to normal operating mode.

12. The self-calibration system of claim 11, further comprising a feedback resistor coupled between the second input of the amplifier and the output of the amplifier.

13. The self-calibration system of claim 11, wherein said means for disconnecting the feedback path comprises:
    means for toggling a first switching element to couple the first terminal of the attenuator to the output of the amplifier; and
    means for toggling a second switching element to couple a second terminal of the attenuator to ground.

14. A system comprising:
    an attenuator having a first terminal configured to receive a user input signal, and a second terminal configured to couple to a load;
    an amplifier having a first input configured to receive a calibration signal;
    a first switching element configured with two selectable switching configurations, wherein the first switching configuration couples the first terminal of the attenuator to a second input of the amplifier, and the second switching configuration couples the first terminal of the attenuator to an output of the amplifier;

a second switching element configured with two selectable switching configurations, wherein the first switching configuration couples a third terminal of the attenuator to the output of the amplifier, and the second switching configuration couples the third terminal of the attenuator to reference ground;

wherein a combination of the first switching configuration for the first switching element and the first switching configuration for the second switching element establishes a servo loop comprising the amplifier with the attenuator as a feedback element, wherein the servo loop operates as a precision signal source having an output impedance that matches an impedance of the load, to deliver the calibration signal to the load.

15. The system of claim 14, further comprising:

a feedback impedance coupled between a second input of the amplifier and an output of the amplifier;

wherein a combination of the second switching configuration for the first switching element and the second switching configuration for the second switching element establishes a return path of the attenuator to ground, to deliver the user input signal to the load.

16. The system of claim 14, wherein the amplifier is a differential amplifier, and wherein the first input of the amplifier is an inverting input, and the second input of the amplifier is a non-inverting input.

17. The system of claim 14, further comprising a resistive element coupled between the first switching element and the first terminal of the attenuator.

18. The system of claim 14, wherein the attenuator, the amplifier, the first switching element, and the second switching element are comprised in a measurement device to provide self-calibration capability to the measurement device;

wherein the measurement device is configured to measure the user input signal.

19. The system of claim 18, wherein the measurement device is an oscilloscope.

20. The system of claim 14, wherein the attenuator comprises:

a first resistor coupled between the first terminal and the second terminal of the attenuator;

a second resistor coupled between the first terminal and the third terminal of the attenuator; and a third resistor coupled between the second terminal and the third terminal of the attenuator.

* * * * *